United States Patent
Oda et al.

(10) Patent No.: US 9,966,439 B2
(45) Date of Patent: May 8, 2018

(54) SEMICONDUCTOR DEVICE AND MANUFACTURING METHOD FOR SAME, CRYSTAL, AND MANUFACTURING METHOD FOR SAME

(71) Applicant: FLOSFIA INC., Kyoto-shi, Kyoto (JP)

(72) Inventors: Masaya Oda, Kyoto (JP); Toshimi Hitora, Kyoto (JP); Tomohiro Yamaguchi, Hachioji (JP); Tohru Honda, Hachioji (JP)

(73) Assignee: FLOSFIA INC., Kyoto (JP)

( * ) Notice: Subject to any disclaimer, the term of this patent is extended or adjusted under 35 U.S.C. 154(b) by 0 days. days.

(21) Appl. No.: 14/904,042

(22) PCT Filed: Jul. 2, 2014

(86) PCT No.: PCT/JP2014/067715
§ 371 (c)(1),
(2) Date: Jan. 8, 2016

(87) PCT Pub. No.: WO2015/005202
PCT Pub. Date: Jan. 15, 2015

(65) Prior Publication Data
US 2016/0149005 A1    May 26, 2016

(30) Foreign Application Priority Data

Jul. 9, 2013  (JP) ................... 2013-144012
Oct. 21, 2013 (JP) ................... 2013-218298

(51) Int. Cl.
| | | |
|---|---|---|
| H01L 21/02 | (2006.01) | |
| C09K 11/80 | (2006.01) | |
| H01L 29/24 | (2006.01) | |
| C01G 15/00 | (2006.01) | |
| C30B 29/16 | (2006.01) | |
| C30B 29/22 | (2006.01) | |
| C30B 25/18 | (2006.01) | |
| C30B 29/40 | (2006.01) | |
| C30B 25/02 | (2006.01) | |
| H01L 29/04 | (2006.01) | |
| H01L 29/12 | (2006.01) | |

(52) U.S. Cl.
CPC .......... *H01L 29/24* (2013.01); *C01G 15/00* (2013.01); *C01G 15/006* (2013.01); *C30B 25/02* (2013.01); *C30B 25/183* (2013.01); *C30B 29/16* (2013.01); *C30B 29/22* (2013.01); *C30B 29/403* (2013.01); *H01L 29/04* (2013.01); *C01P 2002/72* (2013.01); *H01L 29/122* (2013.01)

(58) Field of Classification Search
CPC ............................. H01L 21/02; C04B 35/01
See application file for complete search history.

(56) References Cited

U.S. PATENT DOCUMENTS

| | | | | |
|---|---|---|---|---|
| 7,977,673 | B2* | 7/2011 | Ichinose | ............ C30B 25/02 |
| | | | | 257/41 |
| 2012/0045661 | A1* | 2/2012 | Kumaran | ........... C09K 11/7758 |
| | | | | 428/690 |
| 2015/0225843 | A1 | 8/2015 | Oda | |

FOREIGN PATENT DOCUMENTS

| | | |
|---|---|---|
| JP | 01-189815 A | 7/1989 |
| JP | 2000-349336 A | 12/2000 |
| JP | 2013-028480 A | 2/2013 |
| JP | 2014-234337 A | 12/2014 |

OTHER PUBLICATIONS

International Search Report dated Oct. 14, 2014, issued in corresponding International Application No. PCT/JP2014/067715, filed Jul. 2, 2014, 9 pages.

Ito, H., et al., "Growth and Band Gap Control of Corundum-Structured $\alpha$-$(AlGa)_2O_3$ Thin Films on Sapphire by Spray-Assisted Mist Chemical Vapor Deposition," Japanese Journal of Applied Physics 51(10R):100207-1-100207-3, Oct. 2012.

* cited by examiner

*Primary Examiner* — Khanh T Nguyen
*Assistant Examiner* — Haidung D Nguyen
(74) *Attorney, Agent, or Firm* — Christensen O'Connor Johnson Kindness PLLC

(57) ABSTRACT

A semiconductor device or a crystal that suppresses phase transition of a corundum structured oxide crystal at high temperatures is provided. According to the present invention, a semiconductor device or a crystal structure is provided, including a corundum structured oxide crystal containing one or both of indium atoms and gallium atoms, wherein the oxide crystal contains aluminum atoms at least in interstices between lattice points of a crystal lattice.

16 Claims, 5 Drawing Sheets

Fig. 4
(a)
GALLIUM BROMIDE
ALUMINUM BROMIDE
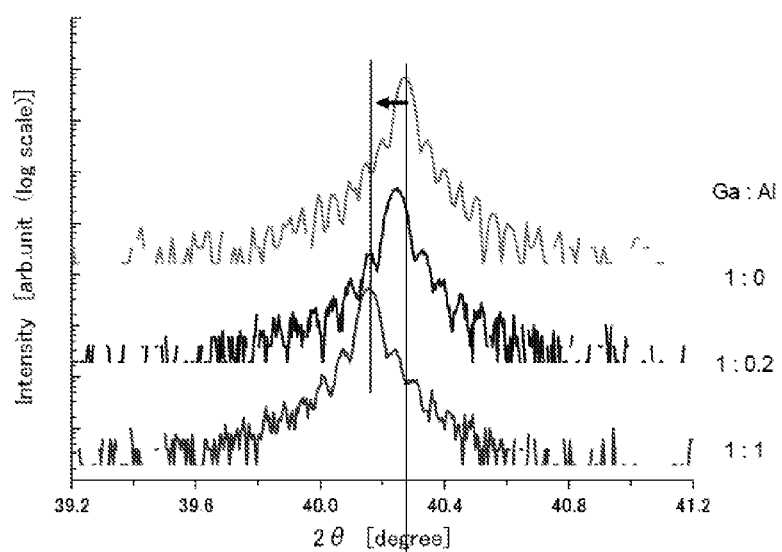
(b)
GALLIUM acac
ALUMINUM acac
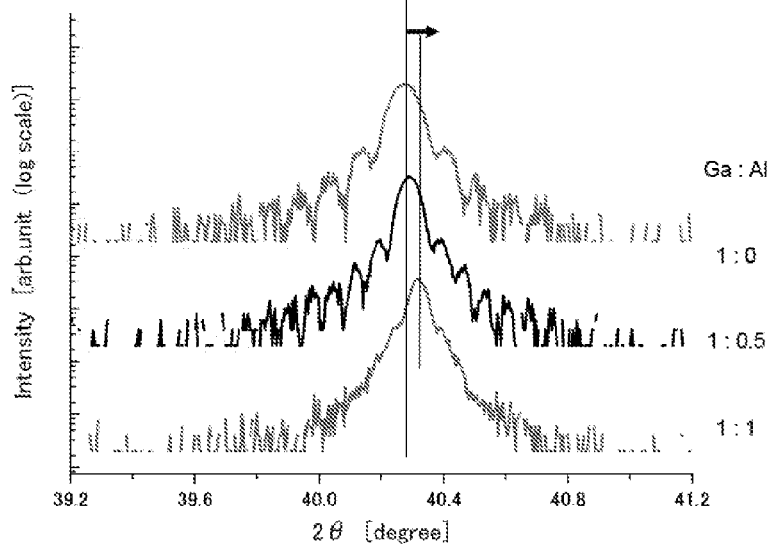

Fig. 7
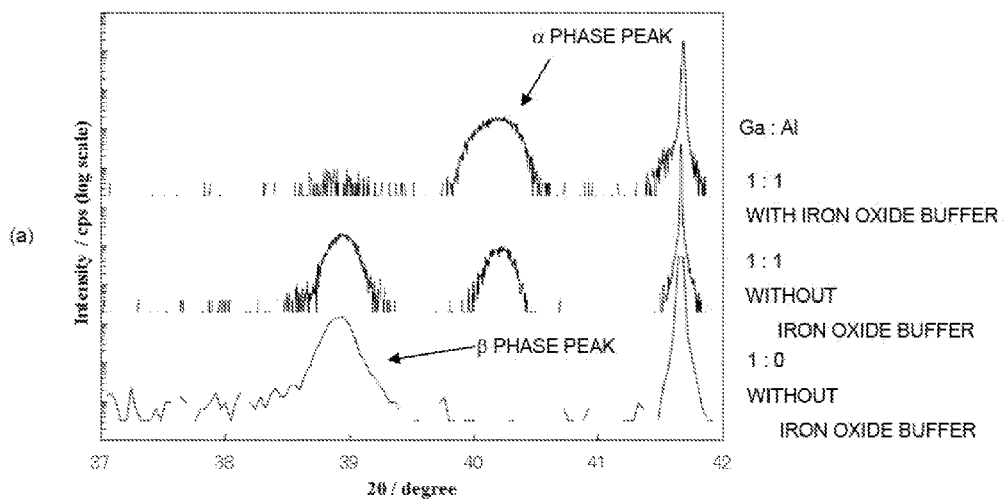
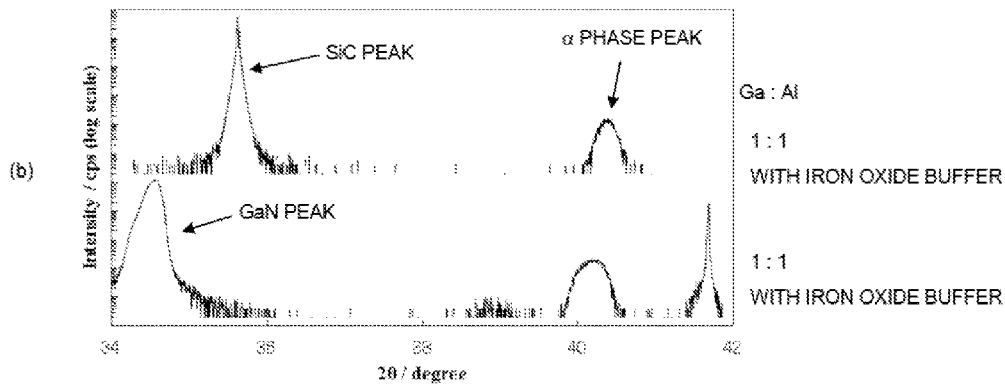

SEMICONDUCTOR DEVICE AND MANUFACTURING METHOD FOR SAME, CRYSTAL, AND MANUFACTURING METHOD FOR SAME

TECHNICAL FIELD

The present invention relates to a semiconductor device having a corundum structured oxide crystal and a method of manufacturing the same and to a crystal and a method of producing the same.

BACKGROUND ART

As a method of forming a single α phase of a high crystalline gallium oxide thin film on a sample to be deposited, mist CVD is known (PLT 1). In this method, a gallium compound, such as gallium acetylacetonate, is dissolved in acid, such as hydrochloric acid, to prepare a raw-material solution, the raw-material solution is atomized to generate a raw-material mist, the raw-material mist is supplied to a film formation surface of a sample to form a film thereon with a carrier gas, and the raw-material mist is reacted at approximately 400° C. to form a thin film on the film formation surface, thereby forming a high crystalline gallium oxide thin film on the sample.

CITATION LIST

Patent Literature

PLT 1: Japanese Unexamined Patent Application Publication No. 2013-28480

Non-Patent Literature

NPL 1: Hiroshi Ito, Growth and Band Gap Control of Corundum-Structured-(AlGa)$_2$O$_3$ Thin Films on Sapphire by Spray-Assisted Mist Chemical Vapor Deposition, Japanese Journal of Applied Physics 51 (2012) 100207

SUMMARY OF INVENTION

Technical Problem

Gallium oxide has an extremely large band gap of 5 eV or more and is expected to be applied to power devices. Among all, corundum structured gallium oxide (α phase) is disclosed in NPL 1 on a technique of mixed crystals with indium, aluminum, iron, chromium, and the like and expected to include various functions and to be applied to devices, such as band gap engineering, due to the mixed crystal. However, the most stable phase of gallium oxide is considered as a beta gallia structure (β phase), and the corundum structure is a metastable phase. The beta gallia structure phase therefore appears after treatment at high temperatures and in film formation at high temperatures. It is thus difficult to be prepared and maintained in a single phase. It is generally considered that a single crystalline phase is preferably used for device application of semiconductors, which is considered as the biggest issue in the device application of a corundum structured gallium oxide-based material. Problems are described below as during film formation and after film formation.

During formation of a film of gallium oxide, with an increase in reaction temperature, the most stable phase is easily formed. As illustrated in FIG. 2 of PLT 1, while a pure α phase is formed up to 400° C., β phase starts to develop at 450° C. and the β phase becomes dominant over the α phase. In such situation, in PLT 1, the raw-material mist is reacted at 400° C. to form a thin film of the α phase. The reaction temperature, however, affects the film deposition rate and the dopant concentration. In case of forming a mixed crystal film, it affects the atomic ratio of the metal elements constituting the mixed crystal film. It is thus desired to appropriately change the reaction temperature in order to optimize these parameters. In particular, since the film formation temperature is desired to be as high as possible in order to reduce impurities in the semiconductor crystal, a high temperature film deposition technique to form the α phase thin film has to be established.

After film formation as well, the semiconductor device process has a step that requires heating. Even when the α phase film deposition is successful, all or a part of the α film results in phase transition to the β phase in the heating step. Specific examples of the heating process may include impurity thermal diffusion process, surface and interface modification process, hot implantation, and post ion implantation crystallinity improvement annealing. It is not realistic to produce a device by avoiding all of the heating process, and improvement of thermal tolerance is necessary for industrial application.

For example, NPL 1 discloses that annealing is effective for tin dopant activation in the β phase of gallium oxide, whereas annealing of α-Ga$_2$O$_3$ in conventional techniques results in phase transition of all or part of the crystal to the β phase.

There is a similar problem in a thin film of a corundum structured oxide crystal containing one or both of indium atoms and gallium atoms.

The present invention has been made in view of such situation, and an object thereof is to provide a semiconductor device or a crystal that suppresses phase transition of a corundum structured oxide crystal at high temperatures.

Solution to Problem

According to a first aspect of the present invention, (1) or (2) below is provided.

(1) A semiconductor device or a crystal structure, including a corundum structured oxide crystal containing one or both of indium atoms and gallium atoms, wherein
the oxide crystal contains aluminum atoms at least in interstices between lattice points of a crystal lattice.

(2) A semiconductor device or a crystal structure, including a corundum structured oxide crystal containing one or both of indium atoms and gallium atoms, wherein
the oxide crystal contains aluminum atoms, and
a c-axis length when the oxide crystal contains the aluminum atoms is more than a c-axis length when the oxide crystal contains no aluminum atom.

When aluminum is contained in a corundum structured oxide crystal by mist CVD, aluminum acetylacetonate is conventionally used as an aluminum source. Raw-material fine particles obtained by atomization of a raw-material solution having aluminum acetylacetonate together with a gallium source dissolved in water used to be supplied to a film formation chamber for film formation of a corundum structured oxide crystal containing aluminum.

Meanwhile, the present inventors supplied raw-material fine particles obtained by atomization of a raw-material solution having aluminum halide as an aluminum source dissolved in water together with a gallium source to a film formation chamber for film formation. While a thin film of a corundum structured oxide crystal was formed, the peak of X-ray diffraction obtained from the thin film thus obtained approximately matches that of gallium oxide in the α phase, which has a corundum structure. It was thus found that very little aluminum was contained in the crystal and that aluminum halide was not appropriate for an aluminum source.

To further develop this approach, the present inventors performed further experiments, such as varying the film formation temperature and heating the thin film thus formed. In the process of the experiments, an interesting phenomenon was found. Although the thin film formed using a raw-material solution containing aluminum halide and a gallium source had a peak of X-ray diffraction approximately matching that of gallium oxide in the α phase, the temperature of the phase transition to the β phase is significantly high in the heating step.

In order to find out the origin of the strange phenomenon, the present inventors checked the graphs of X-ray diffraction again. By observing the peak positions in detail, they noticed that the thin film formed using a raw-material solution containing aluminum halide and a gallium source had the position of X-ray diffraction peak slightly shifting to smaller angles. A shift of the position of X-ray diffraction peak to smaller angles means that a crystal has an increased c-axis length. However, aluminum has a smaller atomic radius than that of gallium, which should cause the position of X-ray diffraction peak shifting to larger angles because the c-axis length should be smaller when gallium is replaced with aluminum. When a thin film was actually formed using a raw-material solution containing aluminum acetylacetonate and a gallium source, the phenomenon of having the position of X-ray diffraction peak shifting to smaller angles was not found.

When gallium is replaced with aluminum, the c-axis length should become smaller. In that case, the phenomenon of increasing the c-axis length by the addition of aluminum leads to that the aluminum added as aluminum halide does not replace gallium but enters interstices between lattice points of the crystal lattice, thereby expanding the crystal lattice. It is considered that the aluminum present in the interstices between the lattice points inhibits phase transition and the phase transition temperature to the β phase when heated is significantly high. It is also considered that such phenomenon is not limited to corundum structured gallium oxide but is similarly applied to a corundum structured oxide crystal containing one or both of indium atoms and gallium atoms.

According to a second aspect of the present invention, (1) or (2) below is provided.

(1) A semiconductor device or a crystal structure, including a corundum structured oxide crystal containing one or both of indium atoms and gallium atoms, wherein the oxide crystal contains aluminum atoms at one or both of lattice points and interstices between lattice points of a crystal lattice, and an atomic ratio of the aluminum atoms present at the lattice points in the crystal lattice of the oxide crystal to a total of the indium atoms and the gallium atoms in the oxide crystal is more than 0 and is 2.9% or less.

(2) A semiconductor device or a crystal structure, including a corundum structured oxide crystal containing one or both of indium atoms and gallium atoms, wherein the oxide crystal contains aluminum atoms, and a c-axis length when the oxide crystal contains the aluminum atoms is 0.9991 times or more a c-axis length when the oxide crystal contains no aluminum atom.

The present inventors prepared a thin film formed of an oxide crystal having aluminum atoms present at lattice points by adding a small amount of aluminum acetylacetonate. The present inventors found regarding such oxide crystal that, even when the atomic ratio of the aluminum atoms at lattice points to the total of the indium atoms and the gallium atoms is a very small amount of more than 0 and 2.9% or less, the aluminum atoms have the effect of suppressing phase transition from the α phase to the β phase. It has not been conventionally known that such a small amount of aluminum atoms exhibits the phase transition suppression effect.

Accordingly, the present inventors disclosed that aluminum atoms in interstices between lattice points exhibited an extremely excellent phase transition suppression effect, whereas those even at lattice points exhibited a phase transition suppression effect to some extent.

In addition, aluminum atoms in a small amount of 2.9% or less do not affect the crystal properties, such as the width of the band gap, much. According to the present invention, an oxide crystal is thus obtained in which phase transition does not occur easily while the original crystal properties of a corundum structured oxide crystal containing one or both of indium atoms and gallium atoms are mostly maintained.

BRIEF DESCRIPTION OF DRAWINGS

FIG. 4(a) shows XRD patterns illustrating shift of the α phase peak to smaller angles with an increase in an amount of aluminum bromide added in a raw-material solution, and 4(b) shows XRD patterns illustrating shift of the α phase peak to larger angles with an increase in an amount of aluminum acetylacetonate added in a raw-material solution.

FIG. 7(a) shows XRD patterns illustrating an effect achieved by providing an iron oxide buffer between a GaN substrate and an oxide crystal; 7(b) shows XRD patterns illustrating formation of an oxide crystal in the α phase even when an iron oxide buffer is provided between a SiC substrate and an oxide crystal.

DESCRIPTION OF EMBODIMENTS

Figure 1:
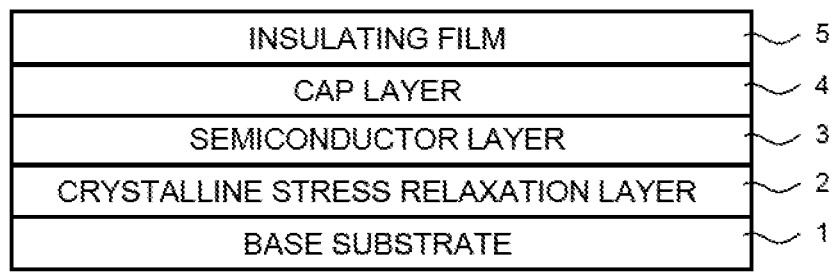
FIG. 1 illustrates a configuration example of a semiconductor device or a crystal structure that may be produced by a method of producing an oxide crystal thin film in an embodiment of the present invention.

1. First Aspect
1-1. Structure of Semiconductor Device or Crystal Structure in First Aspect A semiconductor device or a crystal structure of an embodiment in the first aspect of the present invention includes a corundum structured oxide crystal containing one or both of indium atoms and gallium atoms, wherein the oxide crystal contains aluminum atoms at least in interstices between lattice points of a crystal lattice. The "crystal structure" is a structure including one or more crystal layers and may include a layer other than crystal layers (e.g., amorphous layer). The crystal layer is preferably a monocrystalline layer but may be a polycrystalline layer.

The corundum structured oxide crystal applied in the present embodiment contains one or both of indium atoms and gallium atoms. The aluminum atoms are essentially present in interstices between lattice points of a crystal lattice. Then may be present only in interstices between lattice points and may be present at both interstices between lattice points and lattice points. The "lattice point" herein means a point where a metal atom constituting a corundum structure (e.g., indium atom, gallium atom) is present. When an aluminum atom enters an interstice between lattice points, an atom adjacent to the aluminum atom starts leaving the aluminum atom. The c-axis length of the crystal lattice is thus more than that in the case of no aluminum atom in an interstice between lattice points. The aluminum atom also inhibits phase transition, and thus a phase transition suppression effect is obtained by the presence of the aluminum atom in the interstice between lattice points. The extent of increase in the c-axis length is determined by an amount of aluminum at lattice points and an amount of aluminum in interstices between lattice points. A value of a ratio of a c-axis length when the oxide crystal contains the aluminum atoms to a c-axis length when the oxide crystal contains no aluminum atom is, for example, 1.0001 or more. Specific examples may be 1.0001, 1.0002, 1.0003, 1.0004, 1.0005, 1.0006, 1.0007, 1.0008, 1.0009, 1.001, 1.002, 1.003, 1.004, 1.005, 1.006, 1.007, 1.008, 1.009, 1.01, 1.02, 1.03, 1.04, 1.05, 1.06, 1.07, 1.08, 1.09, and 1.1 and may be in a range between any two of the numerical values exemplified here. The value of this ratio is affected by the composition of the oxide crystal, the film formation method, the fraction of aluminum atoms, and the like. The scope of claims that does not include limitation on the c-axis length is not limited by the value of a ratio of the c-axis length. To minimize measurement error, the c-axis length is preferably measured using the same device for oxide crystals obtained by forming an oxide crystal containing aluminum atoms and an oxide crystal containing no aluminum atom by a same film formation method (e.g., mist CVD) for comparison of the c-axis lengths when the oxide crystal contains the aluminum atoms and no aluminum atom. Since the lattice constant and the c-axis length of the film formation sample are also affected by the sample to form a film thereon, the same sample to form a film thereon should be used for comparison of the c-axis lengths.

An example of the composition of the atoms at the lattice points forming the corundum structure of a corundum structured oxide crystal containing one or both of indium atoms and gallium atoms is a general formula (1).

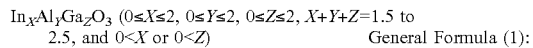

$\text{In}_X\text{Al}_Y\text{Ga}_Z\text{O}_3$ ($0 \le X \le 2$, $0 \le Y \le 2$, $0 \le Z \le 2$, $X+Y+Z=1.5$ to 2.5, and $0<X$ or $0<Z$)      General Formula (1):

Al in the general formula (1) represents aluminum atoms present at lattice points, and thus Y representing the amount of Al may be 0 and may be more than 0 (i.e. $Y>0$). Specifically, in the general formula (1), which becomes $\alpha\text{-Ga}_2\text{O}_3$ when X and Y are 0, $\text{Al}_Y\text{Ga}_Z\text{O}_3$ when only X is 0, $\alpha\text{-In}_2\text{O}_3$ when Y and Z are 0, $\text{In}_X\text{Al}_Y\text{O}_3$ when only Z is 0, and $\alpha\text{-In}_X\text{Al}_Y\text{Ga}_Z\text{O}_3$ when all of X, Y, and Z are not 0, the composition may be Ga rich as $Z \le 0.5$ and $X \ge 0.5$ and the composition may be In rich as $X \ge 0.5$ and $Z \le 0.5$.

Another example of the composition of the atoms at the lattice points forming the corundum structure of a corundum structured oxide crystal is a general formula (2).

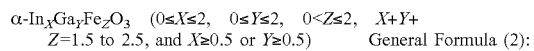

$\alpha\text{-In}_X\text{Ga}_Y\text{Fe}_Z\text{O}_3$ ($0 \le X \le 2$, $0 \le Y \le 2$, $0<Z \le 2$, $X+Y+Z=1.5$ to 2.5, and $X \ge 0.5$ or $Y \ge 0.5$)      General Formula (2):

In the general formulae, specific examples of X, Y, and Z may be, respectively, 0, 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, and 2 and may be in a range between any two of the numerical values exemplified here. Specific examples of X+Y or X+Y+Z may be 1.5, 1.6, 1.7, 1.8, 1.9, 2, 2.1, 2.2, 2.3, 2.4, and 2.5 and may be in a range between any two of the numerical values exemplified here.

The general formulae express the composition of the atoms at the lattice points forming the corundum structure. As clearly seen from not being described as "X+Y+Z=2", a nonstoichiometry oxide is also included, which includes metal-deficient oxide and oxygen-deficient oxide. Although the metal and oxygen atoms present in interstices between lattice points are not contained in the general formulae, the corundum structured oxide crystal applied in the present embodiment includes metal excess oxide and oxygen excess oxide where metal and oxygen atoms are present in interstices between lattice points. The composition represented by the general formulae is preferably composition including both atoms present at lattice points and atoms present in interstices between lattice points. The composition of the corundum structured oxide crystal applied in the present embodiment is not limited to above and may be a crystal where metal elements to be trivalent ion, such as Ti and Ni, are present at the lattice points. To the corundum structured oxide crystal, impurities (e.g., Sn) to give electrical conductivity may be added.

Although the atomic ratio of the aluminum atoms present at lattice points is not particularly limited, it is preferably more than 0 and is 2.9% or less to the total of the indium atoms and the gallium atoms. Such a small amount of aluminum atoms does not affect much the crystal properties, such as the width of the band gap. According to the present embodiment, an oxide crystal is thus obtained in which phase transition does not occur easily while the original crystal properties of the corundum structured oxide crystal containing one or both of indium atoms and gallium atoms are mostly maintained. Specific examples of the atomic ratio of the aluminum atoms may be 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, and 2.9% and may be in a range between any two of the numerical values exemplified here. While the atomic ratio of the aluminum atoms may be strictly determined by SIMS measurement, it may be approximately calculated from the peak of X-ray diffraction.

1-2. Method of Manufacturing Semiconductor Device or Method of Producing Crystal Structure in First Aspect The point of the present invention is the crystal growth in which aluminum atoms enter interstices between lattice points of the corundum structured oxide crystal.

The present inventors succeeded in that aluminum atoms are contained in interstices between lattice points by using aluminum halide (aluminum fluoride, chloride, bromide, and iodide) instead of aluminum acetylacetonate having been used conventionally as the aluminum source in the film formation method to form a film using a micorparticulated raw-material solution (e.g., mist CVD or a similar method) to obtain a corundum structured oxide crystal having an excellent property of being difficult to phase transit.

Therefore, according to an embodiment of the present invention, a method of manufacturing a semiconductor device or a method of producing a crystal structure is provided that includes a crystal forming step forming a corundum structured oxide crystal by supplying raw-material fine particles, generated by atomization of a same or separate raw-material solutions together or separately obtained by dissolving an aluminum compound and one or both of an indium compound and a gallium compound respectively in a solvent, to a film formation chamber, wherein the aluminum compound contains aluminum halide.

Although the present inventors enabled introduction of aluminum atoms to interstices between lattice points by using aluminum halide in the film formation method to form a film using a micorparticulated raw-material solution, another means may be employed as long as the method is capable of introducing aluminum atoms to interstices between lattice points.

Since the oxide crystal formed in the method of the present embodiment is difficult to phase transit, it has advantages of increasing the temperature in the film formation chamber relatively higher and the temperature in the heating step after the crystal forming step higher. Specifically, a semiconductor device may be manufactured by applying device processing, such as ion implantation, etching, and photolithography, to the sample to form a film that has a thin film of the oxide crystal formed thereon and is taken out of the film formation chamber after the crystal forming step. In such device processing, the corundum structured oxide crystal formed in impurity thermal diffusion process, surface and interface modification process, hot implantation, post ion implantation crystallinity improvement annealing, and the like is exposed to high temperatures, and phase transition from the α phase to the β phase easily occurs. However, phase transition does not occur easily in a corundum structured oxide crystal produced in the method of the present embodiment. The temperature of such high temperature process may thus be relatively high, and it is possible to achieve process efficiency, stabilization of the quality of semiconductor devices thus manufactured, and the like. The temperature of heating an oxide crystal in the process after the crystal forming step is, for example, 400° C. or more and preferably from 400 to 1000° C. Specific examples of the temperature may be 400, 500, 600, 700, 800, 900, and 1000° C. and may be in a range between any two of the numerical values exemplified here.

Detailed descriptions are given below to each step of the film formation method to form a film using fine particles generated from a raw-material solution.

1-2-1. Raw-Material Solution

The raw-material solution may be prepared by dissolving an aluminum compound and one or both of an indium compound and a gallium compound respectively in a solvent. Examples of the indium compound may include an indium organometallic complex (e.g., indium acetylacetonate) and indium halide (indium fluoride, chloride, bromide, and iodide). Examples of the gallium compound may include a gallium organometallic complex (e.g., gallium acetylacetonate) and gallium halide (gallium fluoride, chloride, bromide, and iodide). The aluminum compound contains at least aluminum halide. Examples of the aluminum halide may include aluminum fluoride, chloride, bromide, and iodide.

When only aluminum halide is used, very few aluminum atoms are present at lattice points of the oxide crystal thus formed. When aluminum atoms are intended to be present at lattice points of the oxide crystal, it is preferred to use both the aluminum organometallic complex (e.g., aluminum acetylacetonate) and aluminum halide.

The indium compound and the gallium compound are preferably a halide from the perspective, such as the less amount of carbon impurities incorporated in the crystal, the high film deposition rate, and the easy formation of a corundum structure even when a film is formed at high temperatures. A bromide or an iodide is even more preferred, and a bromide is particularly preferred. The aluminum halide is preferably aluminum bromide. This is because, in this case, the aluminum atoms easily enter the interstices between the lattice points. The indium compound, the aluminum compound, and the gallium compound may be dissolved in a raw-material solution, or separately dissolved in respective raw-material solutions. Then, the fine particles of the indium compound, the aluminum compound, and the gallium compound may be generated by atomization from the same raw-material solution, or separately generated by atomization from respective raw-material solutions and then may be mixed in front of or inside the film formation chamber. The indium compound and the gallium compound may be subjected to atomization from one raw-material solution and the aluminum compound from another raw-material solution. From another perspective, when an organometallic complex and a halide are contained as a solute to be dissolved in the raw-material solution, the organometallic complex is preferably a raw-material solution different from a halide. This is because, for example, when aluminum acetylacetonate and gallium bromide are dissolved in one raw-material solution, an anion exchange reaction proceeds to generate gallium acetylacetonate and aluminum bromide, which may cause a problem of reducing the fraction of aluminum atoms at the lattice points of the oxide crystal thus formed.

Although the concentrations of the indium compound, the gallium compound, the aluminum halide, and the aluminum organometallic complex in the raw-material solution are not particularly limited, they are respectively, for example, from 0.001 to 10 mol/L and preferably from 0.005 to 2 mol/L. The concentrations may be 0.001, 0.005, 0.01, 0.02, 0.03, 0.04, 0.05, 0.06, 0.07, 0.08, 0.09, 0.1, 0.2, 0.5, 1, 2, 5, and 10 mol/L and may be in a range between any two of the numerical values exemplified here.

As the solvent for the raw-material solution, various solvents capable of atomization may be used such as water (preferably ultrapure water), an organic solvent (e.g., methanol), and a mixture of water and the organic solvent. From the perspective of reduction of the carbon impurity concentration in the oxide crystal thus formed, the solvent is preferably water and preferably does not contain the organic solvent. A dopant compound may be added in the raw-material solution, and thus it is possible to give conductivity to the thin film thus formed for utilization as a semiconductor layer. Although the reaction solution may contain substances other than the compounds described here, it is preferred not to contain the organic compound. When carbon is used as the doping element, it is possible to add a trace amount of, for example, organic acid (e.g., acetic acid) and the like.

1-2-2. Atomization

Although a method of generating raw-material fine particles by atomization of the raw-material solution is not particularly limited, a method including atomization of the raw-material solution by applying ultrasonic vibration is commonly used. It is also possible to generate raw-material fine particles in a method other than this, for example, by spraying the raw-material solution.

1-2-3. Carrier Gas

The carrier gas is, for example, nitrogen, and a gas, such as argon, oxygen, ozone, and air, may be used. Although the flow rate of the carrier gas is not particularly limited, it is, for example, from 0.1 to 50 L/min and preferably from 0.5 to 10 L/min. Specific examples of the flow rate may be 0.5, 1, 1.5, 2, 2.5, 3, 3.5, 4, 4.5, 5, 5.5, 6, 6.5, 7, 7.5, 8, 8.5, 9, 9.5, and 10 L/min and may be in a range between any two of the numerical values exemplified here.

1-2-4. Film Formation Chamber, Sample to Form Film thereon, Film Formation

The raw-material fine particles are supplied to the film formation chamber with the carrier gas. A reaction occurs in the film formation chamber and a thin film is formed on a sample to form a film thereon that is placed in the film formation chamber. The thin film formed on the sample to form a film thereon is a thin film of a corundum structured oxide crystal (preferably, oxide single crystal).

The film formation chamber is a space for thin film formation and the configurations and the materials are not particularly limited. An example of the film formation chamber has a configuration in which, as in Example, the carrier gas containing the raw-material fine particles is supplied from one end of a quartz tube and exhaust gas is discharged from the other end of the quartz tube. In this configuration, the sample to form a film thereon may be arranged to have the film formation surface horizontal or may be arranged to be tilted, for example, 45 degrees towards the carrier gas supply. A film formation chamber may be utilized that is of the fine channel method utilizing channels of several mm or less as a reaction region, the linear source method in which a linear nozzle is provided on the substrate and the raw-material fine particles (and the carrier gas) are sprayed vertically on the substrate from the nozzle and further the nozzle is moved in a vertical direction from a linear outlet, and a method combining or derived from some methods. The fine channel method enables uniform thin film preparation and improvement in raw material utilization efficiency, and the linear source method enables a large area substrate in the future and continuous film formation by roll-to-roll. The film formation chamber is configured to allow the internal space heated to a desired temperature by, for example, surrounding the film formation chamber and the like. The pressure in the film formation chamber may be increased or reduced from atmospheric pressure.

The heating temperature in the film formation chamber during film formation is not particularly limited as long as it is a temperature capable of causing the raw-material solute (gallium compound, indium compound, aluminum halide, aluminum organometallic complex, etc.) contained in the raw-material solution to chemically react, and it is from 300 to 1500° C., for example. The heating temperature is preferably 500° C. or more and more preferably 550° C. or more. Although film formation at 500° C. or more in conventional techniques cause easy phase transition to the β phase, aluminum halide in the method of the present embodiment functions as a phase transition suppressor and phase transition to the β phase is suppressed. It should be noted that the β phase easily grows at a high heating temperature and thus conditions, such as the raw material supply rate, the raw material composition, and the gas type, have to be optimized for each temperature to obtain a single α phase. Specific examples of the heating temperature may be 300, 400, 450, 500, 510, 520, 530, 540, 550, 560, 570, 580, 590, 600, 700, 800, 900, 1000, and 1500° C. and may be in a range between any two of the numerical values exemplified here.

Although the sample to form a film thereon is not particularly limited as long as it is capable of having a thin film formed thereon, it is preferably a substrate or a thin film having a corundum structure. Examples of the substrate having a corundum structure may include a sapphire substrate and an α-gallium oxide substrate. Examples of the thin film having a corundum structure may include a thin film having a corundum structure formed on a base substrate having a corundum structure or another structure. The substrate or thin film having a corundum structure is preferred because a thin film having a corundum structure, such as α-gallium oxide, is easily formed thereon.

The sample to form a film thereon may be one having no corundum structure. Examples of the sample to form a film thereon having no corundum structure may include a substrate or a thin film having a hexagonal crystal structure (e.g., GaN crystal). On the substrate or thin film having a hexagonal crystal structure, it is possible to form a corundum structured oxide crystal directly or via a buffer layer. As the buffer layer, according to experiments by the present inventors, an iron oxide ($Fe_2O_3$) layer in an amorphous phase that was formed into a film at relatively low temperatures, such as from 200 to 500° C., was particularly effective. The "amorphous phase" herein includes those having crystallites dispersed in the amorphous phase. Specific examples of the film formation temperature of the iron oxide layer may be 200, 250, 300, 350, 400, 450, and 500° C., and may be in a range between any two of the numerical values exemplified here.

FIG. 1 illustrates an example of a semiconductor device or a crystal capable of being produced by the method of the present embodiment. In the example of FIG. 1, on a base substrate 1, a crystalline stress relaxation layer 2, a semiconductor layer 3, a cap layer 4, and an insulating film 5 are formed in this order. On the base substrate 1, they may be laminated from the insulating film 5 in order. The crystalline stress relaxation layer 2 and the cap layer 4 may be omitted when not necessary. When either the base substrate 1 and the semiconductor layer 3 or the semiconductor layer 3 and the insulating film 5 are formed with different materials having a corundum structure, a structural phase transition prevention layer having a corundum structure may be formed at least one of the positions between the semiconductor layer 3 and the insulating film 5, the base substrate 1 and the semiconductor layer 3, the crystalline stress relaxation layer 2 and the semiconductor layer 3, and the cap layer 4 and the insulating film 5. When respective crystal growth temperatures for forming the crystalline stress relaxation layer 2, the semiconductor layer 3, the cap layer 4, and the insulating film 5 are higher than the crystal structure transition temperature of the underlying layer, it is possible to prevent change from the corundum structure to a different crystal structure by forming the structural phase transition prevention layer. When the temperature to form the crystalline stress relaxation layer 2, the semiconductor layer 3, the cap layer 4, and the insulating film 5 is lowered to prevent phase transition of the crystal structure, the crystallinity turns out to be reduced. It is difficult to suppress change in the crystal structure by reducing the film formation temperature, and therefore the formation of the structural phase transition prevention layer is effective.

In addition, a group III nitride crystal layer (thin film) may be formed directly or via a buffer layer on the oxide crystal. The group III nitride crystal layer is preferably oriented to one axis while it may be not oriented to one axis. For mass production of the product, the group III nitride crystal layer is usually formed by a film formation method in which the film formation temperature is at 570° C. or more (MOCVD, HYPE, etc.). When a corundum structured oxide crystal containing one or both of indium atoms and gallium atoms is exposed to such high temperatures, phase transition easily occurs. Conventionally, it was thus difficult to utilize such oxide crystal as a base sample (substrate or thin film) of the group III nitride crystal layer. In contrast, according to the present invention, the phase transition of the oxide crystal is suppressed by the aluminum atoms contained in the interstices between the lattice points, which enables utilization of the oxide crystal as a base sample to form the group III nitride crystal layer.

The film formation temperature is at 570° C. or more and, for example, from 570 to 1300° C., and specific examples may be 570, 600, 650, 700, 750, 800, 850, 900, 950, 1000, 1050, 1100, 1150, 1200, 1250, and 1300° C. and may be in a range between any two of the numerical values exemplified here.

2. Second Aspect 2-1. Structure of Semiconductor Device or Crystal Structure in Second Aspect A semiconductor device or a crystal structure of an embodiment in the second aspect of the present invention includes a corundum structured oxide crystal containing one or both of indium atoms and gallium atoms, wherein the oxide crystal contains aluminum atoms at one or both of lattice points and interstices between lattice points of a crystal lattice, and an atomic ratio of the aluminum atoms present at the lattice points in the crystal lattice of the oxide crystal to a total of the indium atoms and the gallium atoms in the oxide crystal is more than 0 and is 2.9% or less. The description on the "crystal structure" is same as that in the first aspect.

The semiconductor device or crystal structure in the first aspect essentially requires the aluminum atoms present in interstices between lattice points of the crystal lattice, whereas the semiconductor device or the crystal structure in the second aspect does not limit the positions of the aluminum atoms in the corundum structured oxide crystal and the aluminum atoms may be present at one or both of lattice points and interstices between lattice points of the crystal lattice. That is, the aluminum atoms may be present only at lattice points of the crystal lattice, may be present only in interstices between lattice points, or may be present both.

The present inventors found by experiments that aluminum atoms in interstices between lattice points exhibited an extremely excellent phase transition suppression effect while those even at lattice points exhibited a phase transition suppression effect to some extent. They also found that the phase transition suppression effect was exhibited even for a relatively small atomic ratio of the aluminum atoms, such as more than 0 and 2.9% or less of the atomic ratio of the aluminum atoms at lattice points to a total of the indium atoms and the gallium atoms. Such a small amount of aluminum atoms does not affect much the crystal properties, such as the width of the band gap, so that such small amount of aluminum atoms used not to be added conventionally. In the invention of the second aspect, in order to obtain the phase transition suppression effect of the aluminum atoms, not for the purpose of affecting the crystal properties, such as the width of the band gap, aluminum atoms in the amount of 2.9% or less, which was not attempted conventionally, are added. Specific examples of the atomic ratio of the aluminum atoms may be 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, and 2.9% and may be in a range between any two of the numerical values exemplified here.

While the atomic ratio of the aluminum atoms may be strictly determined by SIMS measurement, it may be approximately calculated from the peak of X-ray diffraction.

The c-axis length of the oxide crystal containing aluminum atoms is determined by the amount of aluminum at lattice points and the amount of aluminum in interstices between lattice points. The value of the ratio of the c-axis length when the oxide crystal contains the aluminum atoms to the c-axis length when the oxide crystal contains no aluminum atom is, for example, 0.9991 or more. Specific examples of the value of this ratio may be 0.9991, 0.9992, 0.9993, 0.9994, 0.9995, 0.9996, 0.9997, 0.9998, 0.9999, 1, 1.001, 1.002, 1.003, 1.004, 1.005, 1.006, 1.007, 1.008, 1.009, 1.01, 1.02, 1.03, 1.04, 1.05, 1.06, 1.07, 1.08, 1.09, and 1.1 and may be in a range between any two of the numerical values exemplified here. The value of this ratio is affected by the composition of the oxide crystal, the film formation method, the fraction of aluminum atoms, and the like. The scope of claims that does not include limitation on the c-axis length is not limited by the value of a ratio of the c-axis length. To minimize measurement error, the c-axis length is preferably measured using the same device for oxide crystals obtained by forming an oxide crystal containing aluminum atoms and an oxide crystal containing no aluminum atom by a same film formation method (e.g., mist CVD) for comparison of the c-axis lengths when the oxide crystal contains the aluminum atoms and no aluminum atom. Since the lattice constant and the c-axis length of the film formation sample are also affected by the sample to form a film thereon, the same sample to form a film thereon should be used for comparison of the c-axis lengths.

The description on the corundum structured oxide crystal containing one or both of indium atoms and gallium atoms is same as that in the first aspect. It is also same as the first aspect that a group III nitride crystal layer may be formed directly or via a buffer layer on such oxide crystal.

2-2. Method of Manufacturing Semiconductor Device or Method of Producing Crystal Structure in Second Aspect The method of manufacturing a semiconductor device or method of producing a crystal structure in the second aspect is basically same as the method in the first aspect, so that the descriptions below are mainly focused on the differences.

The first embodiment essentially requires use of aluminum halide as the aluminum compound for introduction of aluminum atoms to the interstices between the lattice points, whereas the present embodiment only defines the amount of the presence of aluminum atoms but does not define the positions of the presence of aluminum atoms. Thus, the type of the aluminum compound is not particularly limited, and for example, one or both of an aluminum organometallic complex and aluminum halide may be used.

In the aluminum compound, a c-axis length when the oxide crystal contains the aluminum atoms is 0.9991 times or more a c-axis length when the oxide crystal contains no aluminum atom. Specifically, the above condition of the c-axis length is achieved when the aluminum compound is mixed to have the atomic ratio of the aluminum atoms present at the lattice points in the crystal lattice of the oxide crystal to the total of the indium atoms and the gallium atoms in the oxide crystal (hereinafter, "aluminum atomic ratio in the oxide crystal") of more than 0 and 2.9% or less.

Therefore, according to the present embodiment, a method of manufacturing a semiconductor device or a method of producing a crystal structure is provided that includes a step of forming a corundum structured oxide crystal by supplying raw-material fine particles, generated by atomization of a same or separate raw-material solutions together or separately obtained by dissolving an aluminum compound and one or both of an indium compound and a gallium compound respectively in a solvent, to a film formation chamber, wherein the aluminum compound is mixed to have a c-axis length when the oxide crystal contains aluminum atoms being 0.9991 times or more a c-axis length when the oxide crystal contains no aluminum atom.

An atomic ratio of the aluminum atoms to the total of the indium atoms and the gallium atoms in the raw materials (hereinafter, "aluminum atomic ratio in the raw materials") does not necessarily match the aluminum atomic ratio in the oxide crystal. The aluminum atomic ratio in the raw materials to achieve the aluminum atomic ratio in the oxide crystal being more than 0 and being 2.9% or less is different depending on the compound to be used. For example, when an aluminum organometallic complex (e.g., aluminum acetylacetonate) is used for the aluminum compound, the aluminum atomic ratio in the oxide crystal easily increases, and thus the aluminum organometallic complex added in the raw materials has to be reduced sufficiently for 2.9% or less of the aluminum atomic ratio in the oxide crystal. Meanwhile, aluminum halide is used for the aluminum compound, the aluminum ratio in the oxide crystal does not easily increase. The atomic ratio of the aluminum atoms in the oxide crystal may thus be reduced much more than 2.9% or less even when the aluminum atomic ratio in the raw materials becomes approximately four times. When all of the indium compound, the gallium compound, and the aluminum compound are halides, the aluminum atomic ratio in the raw materials is, for example, from 0.1 to 20. Specific examples may be 0.1, 0.5, 1, 1.5, 2, 2.5, 3, 3.5, 4, 4.5, 5, 5.5, 6, 6.5, 7, 7.5, 8, 8.5, 9, 9.5, 10, 15, and 20 and may be in a range between any two of the numerical values exemplified here.

3. Third Aspect

According to a third aspect of the present invention, a semiconductor device or a crystal structure is provided that includes: a corundum structured oxide crystal containing one or both of indium atoms and gallium atoms; and a group III nitride crystal layer (thin film) provided directly or via a buffer layer on the oxide crystal. In addition, a method of manufacturing a semiconductor device or a method of producing a crystal structure is provided that includes: a crystal forming step forming a corundum structured oxide crystal by supplying raw-material fine particles, generated by atomization of a same or separate raw-material solutions together or separately obtained by dissolving one or both of an indium compound and a gallium compound respectively in a solvent, to a film formation chamber; and a nitride crystal layer forming step forming a group III nitride crystal layer directly or via a buffer layer on the oxide crystal. It is preferred that the raw-material fine particles contain an aluminum compound. It is preferred that the group III nitride layer is formed by a film formation method in which the film formation temperature is at 570° C. or more (e.g., MOCVD, HVPE) from the perspective of achieving high mass productivity and obtaining good crystallinity.

The first and second aspects are essentially configured to have the oxide crystal containing aluminum atoms, whereas the present aspect is characterized in that a group III nitride crystal layer is provided on the oxide crystal and the oxide crystal does not have to contain aluminum atoms. It should be noted that the oxide crystal preferably contains aluminum atoms to suppress phase transition of the oxide crystal. The descriptions on the compositions, production methods, and the like of the oxide crystal and the group III nitride crystal layer in the first and second aspects are applicable to the present aspect as long as not departing from the spirit.

When the oxide crystal contains no aluminum atom, the group III nitride crystal layer is preferably formed using relatively low temperature process (e.g., MBE) to suppress phase transition of the oxide crystal when the group III nitride crystal layer is formed.

It is preferred that the nitride crystal layer has composition of $In_XAl_YGa_ZN$ ($0 \leq X \leq 1$, $0 \leq Y \leq 1$, $0 \leq Z \leq 1$, $X+Y+Z=0.8$ to 1.2). Specific examples of X, Y, and Z may be 0, 0.01, 0.05, 0.1, 0.2, 0.3, 0.4, 0.5, 0.6, 0.7, 0.8, 0.9, and 1, respectively, and may be in a range between any two of the numerical values exemplified here. Specific examples of X+Y+Z may be 0.8, 0.81, 0.82, 0.83, 0.84, 0.85, 0.86, 0.87, 0.88, 0.89, 0.9, 0.91, 0.92, 0.93, 0.94, 0.95, 0.96, 0.97, 0.98, 0.99, and 1 and may be in a range between any two of the numerical values exemplified here.

A step of nitriding the oxide crystal layer may be provided before the nitride crystal layer forming step. By such nitriding treatment, a surface of the oxide crystal layer is partially or fully subjected to nitriding, which improves the affinity of the oxide crystal layer and the nitride crystal layer. The nitriding treatment may be performed by a method in which, for example, the oxide crystal layer is plasma treated in an atmosphere containing a nitrogen gas. The corundum structured oxide crystal has a crystal structure similar to hexagonal crystal and the group III nitride crystal is also a hexagonal crystal, and thus the nitriding treatment of the corundum structured oxide crystal is easy compared with nitriding treatment of β-gallium oxide. When the oxide crystal layer is partially subjected to nitriding, an oxynitride layer containing one or both of indium atoms and gallium atoms is formed between the oxide crystal layer and the nitride crystal layer.

An oxide crystal layer containing one or both of indium atoms and gallium atoms may be further provided directly or via a buffer layer on the nitride crystal layer. A sandwich structure is thus formed in which the nitride crystal layer is sandwiched by the oxide crystal layers. A nitride crystal layer and an oxide crystal layer may be further formed repeatedly. Such sandwich structure enables formation of quantum well. The oxide crystal layer on the nitride crystal layer may have an α-crystal structure (corundum structure) or may have a β-crystal structure.

4. Fourth Aspect

According to a fourth aspect of the present invention, a semiconductor device or a crystal structure is provided that includes a group III nitride crystal layer; and an oxide crystal layer provided thereon and containing one or both of indium atoms and gallium atoms. In addition, a method of manufacturing a semiconductor device or a method of producing a crystal structure is provided that includes an oxide crystal layer forming step forming an oxide crystal layer directly or via a buffer layer on the group III nitride crystal layer, wherein the oxide crystal layer forming step includes a step of forming an oxide crystal layer by supplying raw-material fine particles, generated by atomization of a same or separate raw-material solutions together or separately obtained by dissolving one or both of an indium compound and a gallium compound respectively in a solvent, to a film formation chamber.

In the present embodiment, an oxide crystal layer is formed on the group III nitride crystal layer. The oxide crystal may have an α-crystal structure (corundum structure) or may have a β-crystal structure. The descriptions on the group III nitride crystal layer in the first through third aspects are applied to the present aspect as long as not departing from the spirit. In the case of the oxide crystal having a corundum structure, the descriptions on the corundum structured oxide crystal in the first through third aspects are applied to the present aspect as long as not departing from the spirit.

In addition, a step of oxidizing the nitride crystal layer may be provided before the oxide crystal layer forming step. By such oxidation treatment, a surface of the nitride crystal layer is partially or fully subjected to oxidation, which improves the affinity of the nitride crystal layer and the oxide crystal layer. The oxidation treatment may be performed by a method in which, for example, a nitride crystal layer is plasma treated in an atmosphere containing oxygen. When the nitride crystal layer is partially subjected to oxidation, an oxynitride layer containing one or both of indium atoms and gallium atoms is formed between the nitride crystal layer and the oxide crystal layer.

A group III nitride crystal layer containing one or both of indium atoms and gallium atoms may be further provided directly or via a buffer layer on the oxide crystal layer. A sandwich structure is thus formed in which the oxide crystal layer is sandwiched by the nitride crystal layers. An oxide crystal layer and a nitride crystal layer may be further formed repeatedly. Such sandwich structure enables formation of quantum well. Further, it is also possible to form a plurality of LED devices longitudinally by combining one or both of a transparent conductive electrode, such as indium oxide and gallium oxide, with an insulating film, such as aluminum oxide and gallium oxide, as the oxide crystal.

The oxide crystal layer and the nitride crystal layer may be doped, and for example, a transparent conductive film of good quality may be formed by doping tin in indium oxide and the insulation may be improved by doping iron in gallium oxide.

Although there is no particular restriction on what to use as the base substrate in the semiconductor device, when each layer of the base substrate, the oxide crystal layer, and the nitride crystal layer forms an interface against respective layers formed from different materials including a base substrate, an oxide crystal layer, and a nitride crystal layer, a lattice constant difference of the respective materials forming the surfaces is preferably small and the materials preferably have relatively close crystal structures, such as trigonal crystal and hexagonal crystal of, for example, a corundum structure. For example, a nitride crystal layer or an InAlGaO-based material, particularly InAlGaO having a corundum structure, is preferably formed on a silicon carbide substrate of 4H or 6H and indium oxide is preferably formed on a gallium substrate.

EXAMPLE

Example of the present invention is described below.
1. CVD Apparatus

Figure 2:
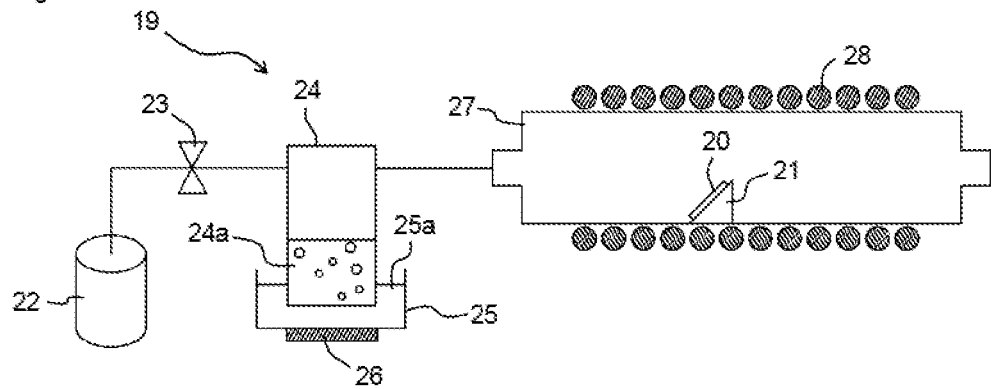
FIG. 2 is a configuration diagram of a mist CVD apparatus used in Example of the present invention.

Firstly, with reference to FIG. 2, a CVD apparatus 19 used in the present Example is described. The CVD apparatus 19 is provided with a sample holder 21 to place a sample 20 to form a film thereon, such as a base substrate, a carrier gas source 22 to supply a carrier gas, a flow rate control valve 23 to control the flow rate of the carrier gas discharged from the carrier gas source 22, a mist source 24 to store a raw-material solution 24a, a container 25 to keep water 25a, an ultrasonic transducer 26 mounted to the bottom of the container 25, a film formation chamber 27 including a quartz tube with an inner diameter of 40 mm, and a heater 28 disposed around the film formation chamber 27. The sample holder 21 is made of quartz and has a surface to place the sample 20 to form a film thereon being tilted from the horizontal plane. Both the film formation chamber 27 and the sample holder 21 are fabricated with quartz, thereby suppressing incorporation of impurities derived from the apparatus into a thin film to be formed on the sample 20 to form a film thereon.

2. Preparation of Raw-Material Solution

Aqueous aluminum/gallium mixed solutions were prepared by dissolving metal bromide in ultrapure water at the raw material concentrations shown in Table 1. NPL 1 was referred for the conditions for Comparative Example. It should be noted that there was no experiment that varied the concentration in NPL 1 and the solutions having same materials, dissolving method, and all other than only the concentrations that were varied were prepared. The raw-material solution 24a was stored in the mist source 24.

3. Preparation for Film Formation

Then, a c-plane α-sapphire substrate of a 10-mm square with a thickness of 600 μm was disposed on the sample holder 21 as the sample 20 to form a film thereon, and the heater 28 was activated to raise the temperature in the film formation chamber 27 up to the temperatures shown in Table 1. Then, the flow rate control valve 23 was opened to supply the carrier gas from the carrier gas source 22 into the film formation chamber 27. After the atmosphere in the film formation chamber 27 was sufficiently purged with the carrier gas, the flow rate of the carrier gas was controlled to 5 L/min. As the carrier gas, a nitrogen gas was used.

4. Thin Film Formation

Then, the ultrasonic transducer 26 was vibrated at 2.4 MHz, and the vibration was propagated through the water 25a to the raw-material solution 24a for atomization of the raw-material solution 24a to generate raw-material fine particles.

The raw-material fine particles were introduced to the film formation chamber 27 with the carrier gas for reaction in the film formation chamber 27, and a thin film was formed on the sample 20 to form a film thereon by a CVD reaction on the film formation surface of the sample 20 to form a film thereon.

5. Evaluation
5-1. Verification of Phase Transition Suppression Effect During Film Formation Table 1 shows the results of identification on the composition ratios and the concentrations of the raw-material solutions, the reaction temperatures, and the crystalline phases of the thin films thus formed.

The crystalline phases were identified by 2θ/ω scan at angles from 15 to 95 degrees using an XRD diffraction apparatus for thin films. The measurement was performed using CuK α ray. In all experiments, only the peaks derived from sapphire of the base substrate and the peaks derived from the oxide crystals having gallium oxide as a main component were detected. In the description in Table 1, "α" denotes a condition in which only the peak derived from the oxide crystal in the α phase having α-$Ga_2O_3$ as a main component was observed, "β" denotes a condition in which the peak of the oxide crystal in the β phase having β-$Ga_2O_3$ as a main component was observed, "β mix" denotes a condition in which both peaks in the α phase and the β phase were observed and no single phase was obtained, and No denotes that no peak was observed.

As clearly seen from Table 1, in the conventional technique where the raw-material solution contained no aluminum at all, it was possible to form an oxide crystal thin film in a single α phase at 500° C., whereas the oxide crystal thin film was in a single β phase or in a mixed phase of the α phase and the β phase at 550° C. or more. In contrast, in Example of the present invention where the raw-material solution contains aluminum, in all aluminum atomic ratios to gallium from 0.2 to 4, it was possible to form the oxide crystal thin film in the single αphase even at a temperature as high as 750° C. In the case of the aluminum atomic ratio to gallium of 4, the oxide crystal thin film in the single α phase was obtained even at a higher temperature of 800° C. These results show that phase transition from the α phase to the β phase was suppressed by adding aluminum to the raw-material solution.

using aluminum bromide, whereas the α phase peaks shift to bigger angles (on the right in FIG. 4) with the increase in the amount of aluminum in FIG. 4(b) using aluminum acetylacetonate. These results show that the positions to arrange the aluminum atoms in the oxide crystal are different depending on the type of aluminum compound to be used and that the c-axis length was made longer because the aluminum atoms entered the interstices between the lattice points when aluminum bromide was used, whereas the

TABLE 1

|  |  | Ga | Al | Temperature | | | | | | |
|---|---|---|---|---|---|---|---|---|---|---|
|  |  | mol/L | mol/L | 500° C. | 550° C. | 600° C. | 650° C. | 700° C. | 750° C. | 800° C. |
| Example | 1:4 | 0.10 | 0.40 | α | | | α | | | α |
|  | 1:2 | 0.10 | 0.20 | | | | | | | β |
|  | 1:1 | 0.10 | 0.10 | α | | α | α | α | α | β |
|  | 1:0.2 | 0.10 | 0.02 | α | | | α | | | |
| Comparative | 1:0 | 0.04 | 0 | | β | | | | | |
| Example |  | 0.05 | 0 | α | | | β mix (NPL 1) | | | |
|  |  | 0.10 | 0 | | | | | | | |
|  |  | 0.15 | 0 | No | No | | | | | |

Figure 3:
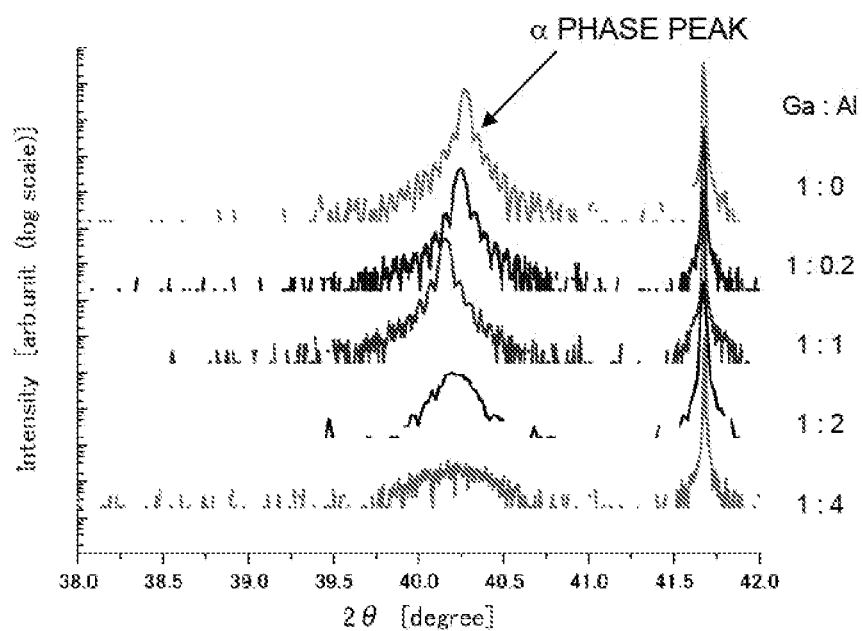
FIG. 3 shows XRD patterns illustrating shift of the α phase peak to smaller angles with an increase in an amount of aluminum bromide added in a raw-material solution.

5-2. Verification of Presence of Aluminum Atoms in Interstices between Lattice Points in Crystal FIG. 3 illustrates a part of XRD patterns used for the identification. FIG. 3 shows the XRD patterns in ascending order of the aluminum ion ratio in the raw-material solution from top to bottom (from top, 1:0, 1:0.2, 1:1, 1:2, and 1:4). The gallium concentration in the raw-material solution was fixed at 0.1 mol/L.

In FIG. 3, the peaks around 41.7 degrees are derived from sapphire ($Al_2O_3$) of the base substrate, and the peaks around 40.3 degrees (hereinafter, the "α phase peak") are derived from the oxide crystal in the α phase having $\alpha$-$Ga_2O_3$ as a main component. The top of five patterns in FIG. 3 was obtained for pure $\alpha$-$Ga_2O_3$ prepared by using the raw-material solution not containing aluminum, and the four patterns below were obtained for the oxide crystals prepared by using the raw-material solution containing aluminum. In the oxide crystals prepared by using the raw-material solutions containing aluminum, aluminum is considered to be contained. When aluminum is assumed to be present at lattice points of the crystal lattice by replacing gallium, the c-axis length of the crystal lattice should become shorter because of the atomic radius of aluminum smaller than that of gallium, and as a result, the α phase peak position should shift to larger angles (on the right in FIG. 3) with the increase in the amount of aluminum. According to actual results of experiments, the α phase peak positions however shift to smaller angles (on the left in FIG. 3) with the increase in the amount of aluminum. These results show that the c-axis length became longer because of the addition of aluminum, and at the same time, that aluminum was present in interstices between lattice points in the crystal.

Here, the influence on the XRD patterns caused by the type of aluminum compound contained in the raw-material solution is described with reference to FIGS. 4(a) and (b). FIG. 4(a) illustrates the results of using aluminum bromide as the aluminum compound and 4(b) illustrates those of using aluminum acetylacetonate as the aluminum compound. As clearly seen from the comparison between them, the α phase peaks shift to smaller angles (on the left in FIG. 4) with the increase in the amount of aluminum in FIG. 4(a)

c-axis length was made shorter because the aluminum atoms entered at lattice points when aluminum acetylacetonate was used.

Then, relationship between shift of the α phase peak and change in the c-axis length is described.

In FIG. 4(a), as shown in Table 2, the α phase peak positions changed 2θ=40.27 to 40.14 degrees when Ga:Al=1:1. Since λ is constant from Bragg's formula (2d sin θ=λ), change in the lattice constant due to addition of Al is obtained from $d_2/d_1$=sin $\theta_1$/sin $\theta_2$ by converting θ before and after the change in α phase peak position into radian for substitution, which becomes $d_2/d_1 \approx 1.0031$ and it is found that the c-axis length became longer approximately 0.3%. By similar calculation, when Ga:Al=1:0.2, $d_2/d_1 \approx 1.0007$.

TABLE 2

| Ga:Al | 2θ | θ(rad) | sinθ | d2/d1 |
|---|---|---|---|---|
| 1:0 | 40.27 | 0.3514 | 0.3442 | |
| 1:0.2 | 40.24 | 0.3512 | 0.3440 | 1.0007 |
| 1:1 | 40.14 | 0.3503 | 0.3432 | 1.0031 |

In FIG. 4(b), as illustrated in Table 3, when Ga:Al=1:1, the α phase peak position changed 2θ=40.27 to 40.309 degrees. Since λ is constant from Bragg's formula (2d sin θ=λ), change in the lattice constant due to addition of Al is obtained from $d_2/d_1$=sin $\theta_1$/sin $\theta_2$ by converting θ before and after the change in alpha phase peak position into radian for substitution, which becomes $d_2/d_1 \approx 0.9991$ and it is found that the c-axis length became shorter approximately 0.1%. Based on the c-axis length of $Al_2O_3$ in the α phase of 12.995 and the c-axis length of $Ga_2O_3$ in the α phase of 13.433, the amount of Al in the oxide crystal of the present Example is calculated by linear approximation, as illustrated in Table 3, the amount of Al became 0.0146 when Ga:Al=1:0.5 and 0.0284 when Ga:Al=1:1.

TABLE 3

| Ga:Al | 2θ | θ(rad) | sinθ | d2/d1 | Amount of Al |
|---|---|---|---|---|---|
| 1:0 | 40.270 | 0.3514 | 0.3442 | | |
| 1:0.5 | 40.290 | 0.3516 | 0.3444 | 0.9995 | 0.0146 |
| 1:1 | 40.309 | 0.3518 | 0.3446 | 0.9991 | 0.0284 |

5-3. Verification of Phase Transition Suppression Effect after Film Formation

Further, experiments for thermal tolerance evaluation during annealing were performed for α-oxide. The film formation conditions were set as the film formation temperature at 500° C., film formation time for 10 minutes, the carrier gas of nitrogen, and the flow rate at 5 L/min.

Figure 5:
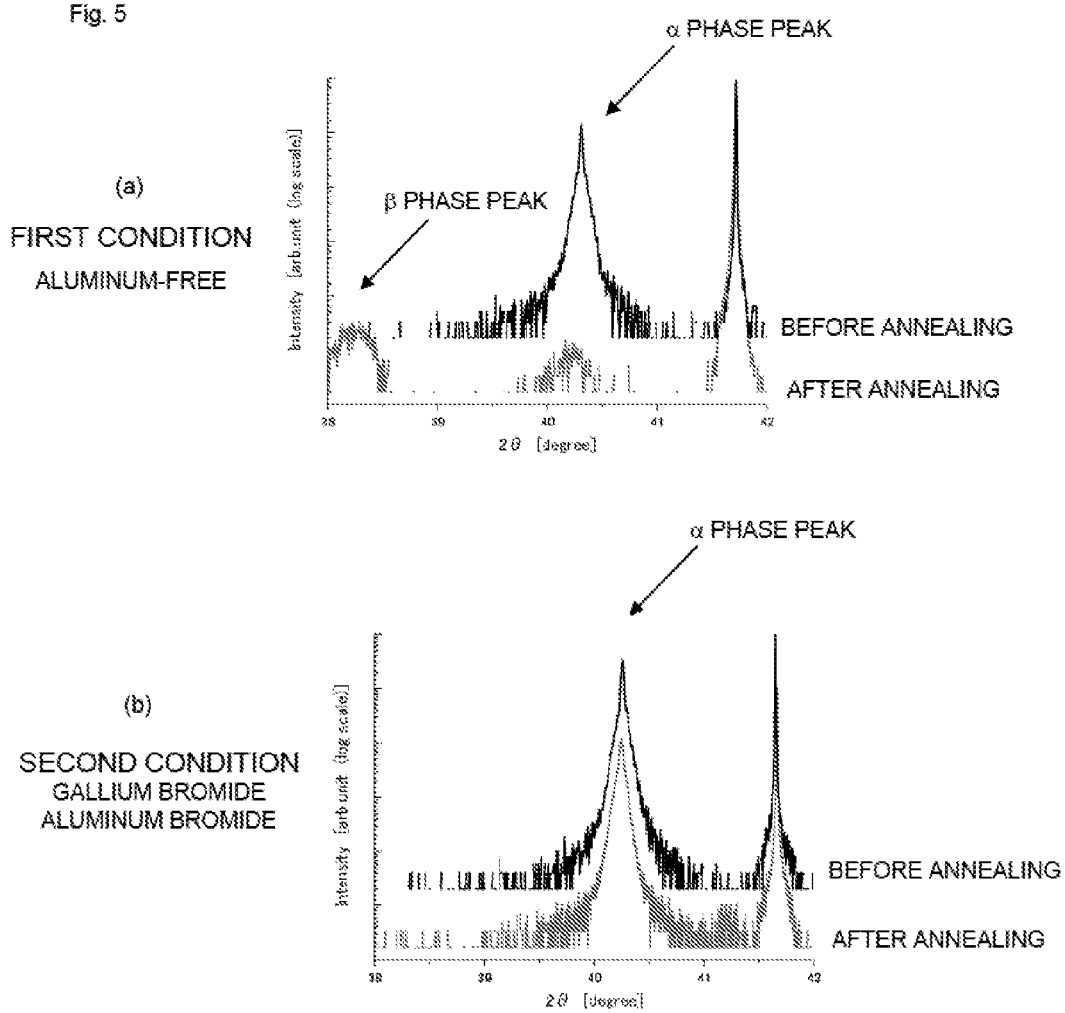
FIG. 5(a) shows XRD patterns of an oxide crystal prepared in a first condition, which is aluminum-free, before and after annealing, and 5(b) shows XRD patterns of an oxide crystal prepared in a second condition, where aluminum bromide is added in a raw-material solution, before and after annealing.

A film was formed using an aqueous solution of 0.1 mol/L of gallium bromide only in a "first condition" and using an aqueous solution prepared to have a concentration of 0.1 mol/L of both gallium bromide and aluminum bromide in a "second condition". After that, it was annealed in a nitrogen atmosphere at 800° C. for 30 minutes. FIGS. 5(a) and (b) illustrates XRD patterns before and after annealing the oxide crystals formed in the first and second conditions. As illustrated in FIG. 5(a), in the "first condition" where the raw-material solution does not contain an aluminum compound, the peak derived from the β phase was clearly observed around 38 degrees, and on the contrary, a significant reduction was found in the peak intensity derived from the α phase. This means that phase transition from the α phase to the β phase occurred. In contrast, as illustrated in FIG. 5(b), in the "second condition" where the raw-material solution contains an aluminum compound, only the peak derived from the α phase around 40 degrees was observed and there was no big difference between the peak intensity before and after annealing. It is therefore found that phase transition did not occur and the crystal film maintained the corundum structure. Totally from the results of FIGS. 4 and 5, it is understood that aluminum bromide contained in the raw-material solution caused introduction of the aluminum atoms to the interstices between the lattice points and the aluminum atoms suppressed phase transition. The fact that the α-oxide crystal thin film obtained by the present invention maintains the α-structure even after annealing at 800° C. suggests applicability for many existing mass production process, such as impurity thermal diffusion process, surface and interface modification process, hot implantation, and post ion implantation crystallinity improvement annealing, which exhibits the usefulness of the present invention.

Figure 6:
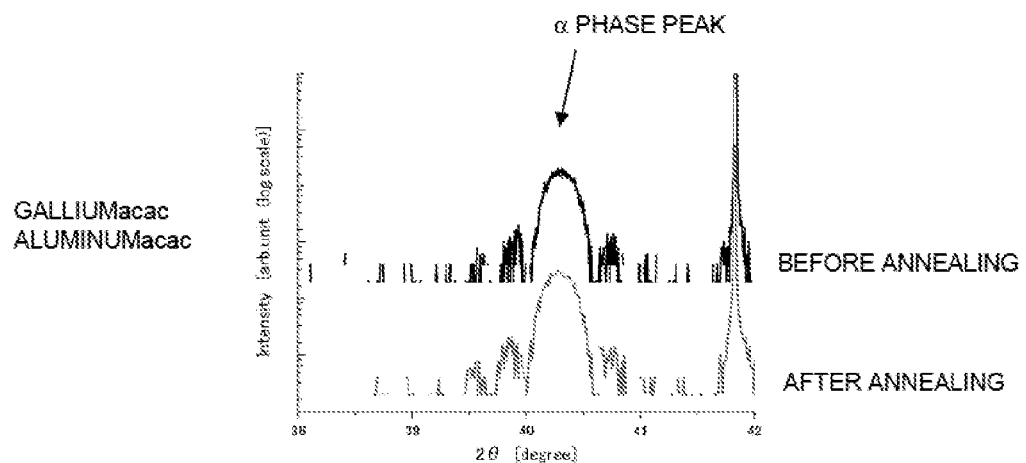
FIG. 6 shows XRD patterns of an oxide crystal prepared in a condition, where aluminum acetylacetonate is added in a raw-material solution, before and after annealing.

FIG. 6 illustrates XRD patterns corresponding to Ga:Al=1:0.5 in FIG. 4(b), which shows that phase transition was suppressed by adding the aluminum atoms.

5-4. Group III Nitride Layer Formation Experiment on Corundum Structured Oxide Crystal On the oxide crystal formed in the second condition in above "5-3", a group III nitride layer was formed by MOCVD where the film formation temperature is 800° C. or more. The XRD patterns of the oxide crystal was measured to find that, similar to FIG. 5(b), the intensity of the α phase peaks hardly changed before and after the film formation of the group III nitride layer.

5-5. Corundum Structured Oxide Crystal Thin Film Formation Experiment on Substrate Having Hexagonal Crystal Structure On a commercially available GaN substrate, an iron oxide buffer layer was formed by mist CVD. The iron oxide buffer layer was formed using the CVD apparatus 19 above, and the film formation temperature was 300° C. The conditions of the carrier gas and the atomization were same as above. The film formation was performed for 30 seconds. Then, oxide crystals were formed in three conditions of (1) the first condition in above "5-3" with no iron oxide buffer layer (note that the film formation temperature was at 600° C.), (2) the second condition in above "5-3" with no iron oxide buffer layer (note that the film formation temperature was at 600° C., same below), and (3) the second condition in above "5-3" with an iron oxide buffer layer to measure the XRD patterns of the oxide crystals. FIG. 7(a) illustrates the results. As illustrated in FIG. 7(a), when a film was formed in the second condition in above "5-3" with an iron oxide buffer layer, an oxide crystal in a single α phase was formed. Only the β phase was observed in the first condition where aluminum was not present, whereas the α phase appears in the second condition where a trace amount of aluminum was present in the crystal film, which significantly represents the effects of the present invention. Similar results were obtained even when the film formation temperature of the iron oxide buffer layer was 350° C.

In addition, on a commercially available SiC substrate, an iron oxide buffer layer was formed in a method same as above and an oxide crystal was formed in the second condition in above "5-3" (note that the film formation temperature was at 600° C., same below) to measure the XRD patterns of the oxide crystal. FIG. 7(b) illustrates the results. As illustrated in FIG. 7(b), an oxide crystal in a single α phase was formed via an iron oxide buffer layer over the SiC substrate.

5-6. GaN Thin Film Formation Experiment on α-Gallium Oxide Thin Film

On a (0001) sapphire substrate, an α-gallium oxide thin film was formed by mist CVD. As the raw-material solution, a solution of gallium acetylacetonate dissolved in ultrapure water to have the concentration of 0.1 mol/L. The film formation conditions was set as the film formation temperature at 500° C., the film formation time for 10 minutes, the carrier gas of oxygen, and the flow rate at 5 L/min.

Then, the α-gallium oxide thin film was delivered into an MBE apparatus. The α-gallium oxide thin film temperature was set at 750° C., and surface nitriding treatment was performed by irradiating nitrogen plasma on the α-gallium oxide thin film. The formation of a gallium nitride layer on the surface of the α-gallium oxide thin film by the nitriding treatment was confirmed by high energy electron diffraction measurement and X-ray photoelectron spectroscopy. In such a manner, film formation of a GaN thin film was performed by irradiating gallium and nitrogen plasma in an MBE apparatus on an α-gallium oxide thin film having a gallium nitride layer formed on the surface.

5-7. Gallium Oxide Thin Film Formation Experiment on GaN Substrate

As the substrate for growth, a (0001) GaN substrate was used. After the substrate was subjected to organic cleaning, a gallium oxide thin film was grown thereon by mist CVD. As the raw-material solution, a solution of gallium acetylacetonate dissolved in ultrapure water to have a concentration of 0.1 mol/L. The film formation conditions were set as the film formation temperature at 430° C., 450° C., 470° C., the film formation time for 60 minutes, the carrier gas of oxygen, and the flow rate at 5 L/min.

The XRD patterns for the gallium oxide thin film thus formed were measured. As a result, regardless of the film formation temperature, β phase peaks were observed and no α phase peak was observed. The gallium oxide thin film was evaluated for electrical property to show a value as high as 0.8 MSΩcm.

REFERENCE SIGNS LIST

1: Base Substrate
2: Crystalline Stress Relaxation Layer
3: Semiconductor Layer
4: Cap Layer
5: Insulating Film
19: Mist CVD Apparatus
20: Sample to Form Film thereon
21: Sample Holder
22: Carrier Gas Source
23: Flow Rate Control Valve
24: Mist Source
24a: Raw-Material Solution
25: Mist Source
25a: Water
26: Ultrasonic Transducer
27: Film Formation Chamber
28: Heater

The invention claimed is:

1. A semiconductor device or a crystal structure, comprising a corundum structured oxide crystal containing one or both of indium atoms and gallium atoms, wherein
the oxide crystal contains aluminum atoms at least in interstices between lattice points of a crystal lattice.

2. The semiconductor device or crystal structure of claim 1, wherein a composition of the atoms at the lattice points forming the corundum structure of the oxide crystal is $In_X Al_Y Ga_Z O_3$ ($0<X\leq2$, $0\leq Y\leq2$, $0\leq Z\leq2$, $X+Y+Z=1.5$ to $2.5$; or $0\leq X\leq2$, $0\leq Y\leq2$, $0<Z\leq2$, $X+Y+Z=1.5$ to $2.5$).

3. The semiconductor device or crystal structure of claim 2, wherein $0<Y$.

4. The semiconductor device or crystal structure of claim 1, wherein a group III nitride crystal layer is provided directly or via a buffer layer on the oxide crystal.

5. A semiconductor device or a crystal structure, comprising a corundum structured oxide crystal containing one or both of indium atoms and gallium atoms, wherein the oxide crystal contains aluminum atoms, and
an atomic ratio of the aluminum atoms present at the lattice points in the crystal lattice of the oxide crystal to a total of the indium atoms and the gallium atoms in the oxide crystal is more than 0 and is 2.9% or less.

6. The semiconductor device or crystal structure of claim 5, wherein a composition of the atoms at the lattice points forming the corundum structure of the oxide crystal is $In_X Al_Y Ga_Z O_3$ ($0<X\leq2$, $0\leq Y\leq2$, $0\leq Z\leq2$, $X+Y+Z=1.5$ to $2.5$; or $0\leq X\leq2$, $0\leq Y\leq2$, $0<Z\leq2$, $X+Y+Z=1.5$ to $2.5$).

7. The semiconductor device or crystal structure of claim 6, wherein $0<Y$.

8. The semiconductor device or crystal structure of claim 5, wherein a group III nitride crystal layer is provided directly or via a buffer layer on the oxide crystal.

9. A semiconductor device or a crystal structure, comprising a corundum structured oxide crystal containing one or both of indium atoms and gallium atoms, wherein the oxide crystal contains aluminum atoms, and
a c-axis length when the oxide crystal contains the aluminum atoms is longer than a c-axis length when the oxide crystal contains no aluminum atom.

10. The semiconductor device or crystal structure of claim 9, wherein a composition of the atoms at the lattice points forming the corundum structure of the oxide crystal is $In_X Al_Y Ga_Z O_3$ ($0<X\leq2$, $0\leq Y\leq2$, $0\leq Z\leq2$, $X+Y+Z=1.5$ to $2.5$; or $0\leq X\leq2$, $0\leq Y\leq2$, $0<Z\leq2$, $X+Y+Z=1.5$ to $2.5$).

11. The semiconductor device or crystal structure of claim 10, wherein $0<Y$.

12. The semiconductor device or crystal structure of claim 9, wherein a group III nitride crystal layer is provided directly or via a buffer layer on the oxide crystal.

13. A semiconductor device or a crystal structure, comprising a corundum structured oxide crystal containing one or both of indium atoms and gallium atoms, wherein the oxide crystal contains aluminum atoms, and
a c-axis length when the oxide crystal contains the aluminum atoms is 0.9991 times or more as long as a c-axis length when the oxide crystal contains no aluminum atom.

14. The semiconductor device or crystal structure of claim 13, wherein a composition of the atoms at the lattice points forming the corundum structure of the oxide crystal is $In_X Al_Y Ga_Z O_3$ ($0<X\leq2$, $0\leq Y\leq2$, $0\leq Z\leq2$, $X+Y+Z=1.5$ to $2.5$; or $0\leq X\leq2$, $0\leq Y\leq2$, $0<Z\leq2$, $X+Y+Z=1.5$ to $2.5$).

15. The semiconductor device or crystal structure of claim 14, wherein $0<Y$.

16. The semiconductor device or crystal structure of claim 13, wherein a group III nitride crystal layer is provided directly or via a buffer layer on the oxide crystal.

* * * * *